United States Patent [19]

Gauthier

[11] 3,887,995

[45] June 10, 1975

[54] PROCESS OF MANUFACTURE OF SOLAR CELLS

[75] Inventor: André Gauthier, Paris, France

[73] Assignee: Societe Anonyme de Telecommunications, France

[22] Filed: July 12, 1973

[21] Appl. No.: 378,521

[30] Foreign Application Priority Data

July 28, 1972 France .............................. 72.27227

[52] U.S. Cl. ...................................... 29/572; 136/89

[51] Int. Cl. ............................................ H01l 15/02

[58] Field of Search .......................... 136/89; 29/572

[56] References Cited

UNITED STATES PATENTS

| | | | |
|---|---|---|---|
| 2,884,508 | 4/1959 | Czipott et al. | 136/89 X |
| 3,186,874 | 6/1965 | Gorski | 136/89 |
| 3,255,047 | 6/1966 | Escoffery | 136/89 |
| 3,350,775 | 11/1967 | Iles | 29/572 |
| 3,411,952 | 1/1968 | Ross et al. | 136/89 |
| 3,453,711 | 7/1969 | Miller | 29/572 X |
| 3,713,893 | 1/1973 | Shirland | 136/89 |

OTHER PUBLICATIONS

L Clarke et al., "New Developments in Degradation-Resistant CdS Solar Cells in Power Sources," 1970, pp. 1-12.

Mytton et al., "Integrated High Voltage CdS Solar Batteries, " in 8th IEEE Photovoltaic Specialists Conf., 4-6, Aug., 1970, pp. 30-32.

*Primary Examiner*—Allen B. Curtis

[57] ABSTRACT

A solar cell comprising two electrodes, a collector grid, a copper sulphide layer and a cadmium sulphide layer, wherein the two electrodes are constituted by a single conductive film divided into two parts separated by an insulating material, said sulphide layers being deposited on one of said parts and surmounted by said collector grid which is electrically connected to said other part of the conductive film.

3 Claims, 4 Drawing Figures

PROCESS OF MANUFACTURE OF SOLAR CELLS

The present invention relates to a new structure of cadmium sulphide (CdS) solar cells.

Such known solar cells are formed by superimposed layers of different chemical media namely: an insulating support such as kapton, a conductive lacquer, usually containing silver, which constitutes the *n* electrode, a layer of CdS and a layer of $Cu_2S$ which are the active layers of the solar cell and a collector grid which constitutes the *p* electrode.

By way of example, such cells may be obtained by the technical processes disclosed in French Pat. No. 1,562,163. According to this patent, the collector grid is constructed from a sheet of copper by photoengraving and gold plating. The fixing of this grid on the layer of $Cu_2S$ is obtained by means of a conductive adhesive which is usually a gold-containing adhesive.

The superimposition of these layers results in a difference in level between the two electrodes and the latter are located in different planes parallel spaced apart a distance equal to the sum of the thicknesses of the various chemical layers constituting the solar cell. In most of their utilizations in which said solar cells are associated in series and/or in parallel so as to constitute panels, this difference in level between the two electrodes is a drawback. An object of the present invention is to overcome this drawback.

The invention therefore provides a solar cell comprising two electrodes, a collector grid, a layer of copper sulphide and a layer of cadmium sulphide, wherein the two electrodes are constituted by a single conductive film divided into two parts separated by an insulating material, said sulphide layers being deposited on one of said parts and surmounted by said collector grid which is electrically connected to said other part of the conductive film.

The main advantage of the solar cell according to the invention resides in the fact that its two electrodes are in the same plane which thus facilitates the assembly of the cells.

Another object of the invention is to provide a process for manufacturing the aforementioned solar cell, comprising depositing a conductive film simultaneously on the same support in two parts separated from each other. This process absolutely ensures that the two electrodes have exactly the same thickness.

In one embodiment, the support is flexible.

Preferably, the collector grid is obtained by direct electrolytic deposition on the surface of the cell in the course of manufacture.

Preferably, the collector grid is electrically connected to the second electrode by deposition of a layer of conductive lacquer insulated from the layers of $Cu_2S$ and CdS and from the first electrode by deposition of a layer of insulating varnish.

By means of this process, the cost of the cell is lowered and its weight reduced.

The elimination of the operation for adhering the grid avoids heating the cell for the polymerization of the adhesive and this reduces the risk of deterioration of the cell in the course of manufacture.

Further, the grid obtained by electrolytic deposition may have an advantageously chosen shape in contradistinction to grids which are attached and whose construction involves, above all, requirements which are of a mechanical nature.

Further features and advantages of the solar cell according to the invention will be apparent from the ensuing description with reference to the accompanying drawing in which.

Figure 1:
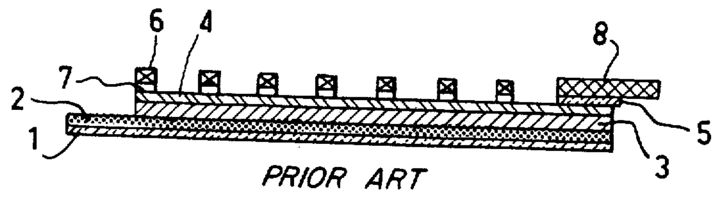
FIG. 1 is given to show a sectional view of a CdS solar cell of known type.

In a CdS solar cell of known type, such as that shown in section in FIG. 1, there are in succession, starting from the lower part, an insulating support 1, constituted by a sheet of kapton, a conductive layer 2 constituted by a silver lacquer, a layer 3 of CdS, a layer 4 of $Cu_2S$ and a grid 6 adhered to said layer 4 by a layer of conductive adhesive 7. The extension of the grid 6 in the form of a metal plate 8 constitutes the second electrode of the solar cell, the layer 2 of silver lacquer constituting the first electrode.

In order to ensure that the metal plate 8 does not short circuit the solar cell, a piece of insulating sheet 5, such as a sheet of kapton, is interposed between the plate 8 and the layer 4 of $Cu_2S$.

In FIG. 1 the difference in level between the two electrodes 2 and 8 is clearly shown.

Figure 2:
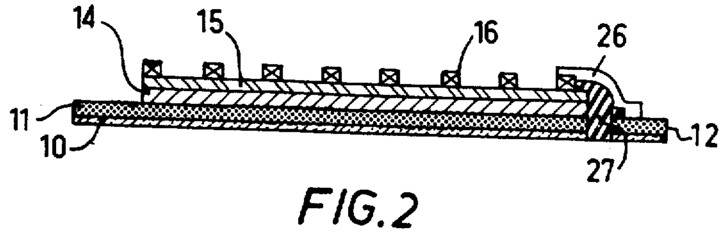
FIG. 2 is a sectional view of the solar cell according to the invention.

In order to overcome this drawback of differences of level, the solar cell according to the invention has a new arrangement which is shown in FIG. 2.

Figure 3:
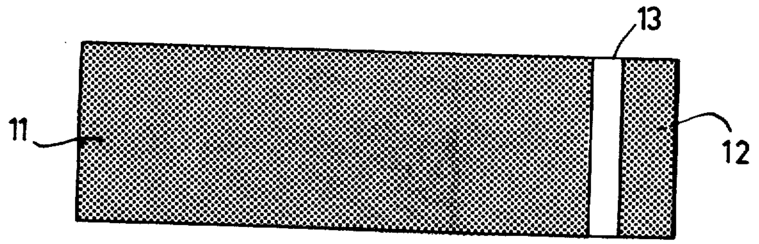
FIG. 3 is a plan view of the two electrodes of the cell according to the invention.

According to the invention, there is deposited on an insulating support 10, such as a sheet of kapton, a conductive film or layer, for example of silver lacquer deposited as shown in FIG. 3 in two distinct plates 11 and 12 separated by a zone 13 in which the insulating sheet remains bare. Deposited on the conductive zone 11 by known means are the layers of CdS and $Cu_2S$ 14 and 15 of the solar cell. Directly fixed to the layer 15 is the collector grid 16 which is obtained, according to the present invention, by a new application to the construction of solar cells of the known process of electrolytic deposition.

To this end, there is formed a photoengraving on the layer of $Cu_2S$ so as to obtain the image of the grid so that the parts of $Cu_2S$ remaining bare constitute the pattern of the desired grid, all the silver-coated zones being equally masked by the photo-resistant product with the exception of the end of the electrode 11.

Any other masking method, such as serigraphy for example, may also be employed.

Figure 4:
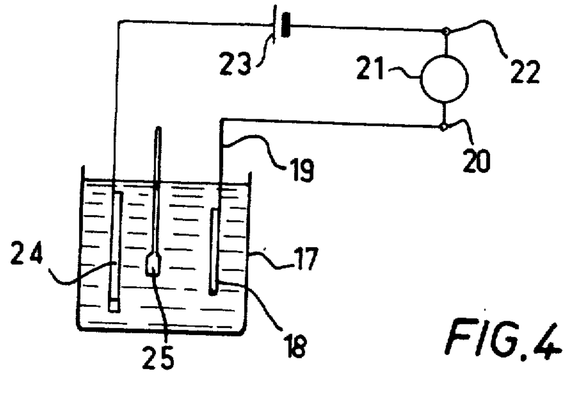
FIG. 4 is a diagrammatic view of an apparatus for the electrolytic deposition of the grid of the solar cell according to the invention.

The grid 16 is thereafter deposited electrolytically on the unmasked parts of the solar cell in course of manufacture, this operation being carried out in accordance with the diagram shown in FIG. 4. The tank 17 contains an electrode 18 which is a gold salt solution, the cathode being constituted by the solar cell in the course of manufacture which is connected by the end 19 of its *n* electrode to the first terminal 20 of an ammeter 21 the second terminal 22 of which is connected to the negative terminal of a dc supply 23 whose positive terminal is connected to the anode 24 of the electrolysis device. This anode, whose surface area is at least equal to the surface area of the cell, is constituted by a platinum plate. The temperature of the electrolytic solution 18 is controlled by means of a thermometer 25 which is immersed in the solution. The pH of this solution is adjusted to between 7 and 10. The current density is so chosen as to produce an adherent metallic deposit and it must not exceed a certain value beyond which the CdS-$Cu_2S$ junction is liable to be impaired. This value is a function of the respective thickness of the layers of CdS and $Cu_2S$. Bearing in mind the usual thicknesses of these layers the current density is between 5 and 20 milliampere per square centimetre.

The thickness of the metallic deposit constituting the grid is so determined as to reduce the resistance of the cell as far as possible. This thickness is obtained by the control of the amount of electricity employed. Good results are obtained with a thickness of 3–5 microns.

After the grid has been deposited, the masking product is removed by means of xylene or trichlorethylene, the solar cell is then rinsed with alcohol and dried in a vacuum.

According to the invention, the grid 16 is electrically connected to the *p*-type electrode 12 by means of a layer 26 of conductive lacquer which is insulated from the layers $Cu_2S$ and CdS and from the *n*-type electrode by a layer of insulating varnish 27 which bears on the zone 13—which had been left bare up till now—of the insulating support 10 of the solar cell.

The solar cell according to the invention has the great advantage of having its two electrodes in the same plane. The construction of a solar panel by means of the solar cells according to the invention is thus facilitated.

The manufacture of the collector grid of the solar cell according to the invention by electrolytic deposition has the advantage of lowering the usual price of CdS solar cells and reducing the weight of said cells while allowing more elaborate grid conformations and avoiding any danger of deterioration of said cell by the heating of the latter in the course of polymerization of the gold-containing adhesive which serves to fix the collector grids obtained by the known processes.

The cells according to the invention have the same uses as the known solar cells.

Further, the electrical connection of the collector grid with the cell is achieved perfectly since the electrolytic deposition occurs by passage of the electrolytic current through the cell.

What I claim is:

1. A process for manufacturing a solar cell comprising two electrodes, a collector grid, a copper sulphide layer and a cadmium sulphide layer, said process comprising depositing on an insulating support a conductive layer or film in two distinct areas separated by a zone in which the insulating sheet remains bare, successively depositing on one of said areas a layer of CdS and a layer of $Cu_2S$, forming a mask on the layer of $Cu_2S$, electrolytically depositing a metal on said masked layer of $Cu_2S$ by using said conductive layer deposited on said first area as a cathode for an electrolysis device and removing the mask on said layer of $Cu_2S$.

2. A process for manufacturing a solar cell according to claim 1 wherein the two electrodes are disposed in the same plane and are of the same thickness.

3. A process for manufacturing a solar cell according to claim 1 wherein the electrolytic deposition is carried out at a current density of 5–20 milliamperes/$cm^2$.

* * * * *